United States Patent [19]

McDermott et al.

[11] 4,366,560
[45] Dec. 28, 1982

[54] POWER DOWN DETECTOR

[75] Inventors: Mark W. McDermott, Austin; Neil B. Feldman, Manchaca, both of Tex.

[73] Assignee: Motorola, Inc., Schaumburg, Ill.

[21] Appl. No.: 189,974

[22] Filed: Sep. 22, 1980

[51] Int. Cl.³ .................. H02H 3/24; G08B 21/00; H03K 5/00; H03K 3/26
[52] U.S. Cl. .................. 365/228; 307/200 A; 307/200 B; 307/238.3; 307/362; 307/279; 340/663; 361/92; 365/95; 365/154
[58] Field of Search ........... 307/200 A, 200 B, 238.3, 307/279, 291, 362, 363, 593, 594; 340/663; 361/92; 365/95, 154, 228

[56] References Cited
U.S. PATENT DOCUMENTS
3,753,011  8/1973  Faggin .................. 307/238.3
4,013,902  3/1977  Payne .................... 307/363

Primary Examiner—George G. Stellar
Attorney, Agent, or Firm—Anthony J. Sarli, Jr.

[57] ABSTRACT

A circuit for detecting power supply variations in which a first and second transistor are connected in a cross-coupled mode. A load device is connected to each transistor and to a source of power. The loads are unbalanced such that upon application of power to the circuit a first state is always assumed. The cell is forced to its second state. A charge transfer device is connected between first and second nodes formed at the connection between the first transistor and its load and the second transistor and its load. Upon reduction of power supply voltage below that of the active node, a charge transfer takes place which allows the cell to return to its initial state. Detection of the initial state indicates loss or reduction of power has occurred.

10 Claims, 1 Drawing Figure

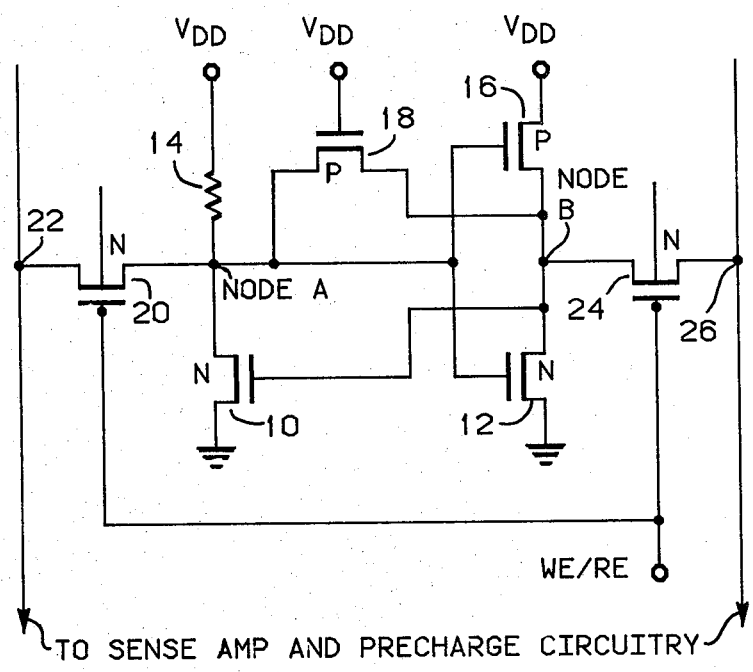

POWER DOWN DETECTOR

TECHNICAL FIELD

This invention relates to semiconductor circuits and more specifically to a semiconductor circuit for indicating fluctuation in power of, or loss of power to, a unit.

BACKGROUND ART

In some applications it is desirable or even necessary to be aware of an interruption of electrical power to a particular electronic device. For example, semiconductor memory devices are power sensitive in that, if supply voltage is reduced below some threshold value, or is completely removed, the data stored within the memory is destroyed. Similarly, a computer or microprocessor stores data temporarily in its register structure which, in the event of a power fluctuation or removal may be destroyed.

In certain applications, particularly those wherein the operation of a device of concern is not continually monitored, a temporary reduction or loss of power may not be noticed by the operator. A subsequent attempt to utilize the device may result in manipulation of incorrect data. For example, a semiconductor memory module or processor which is maintained for long periods of time without actual use, and which may be operated during this period by a battery source of supply (an automobile engine control device, for example) may, when it is put back into use, contain or operate upon incorrect data. It is desirable that a user or operator of such a device be able to determine whether any fluctuation or interruption has occurred to the source of power. The operator can then take appropriate action such as reloading the data into a memory or resetting the microprocessor internal registers.

BRIEF SUMMARY OF INVENTION

Accordingly, it is an object of the instant invention to provide a means for detecting a fluctuation or interruption in power supplied to a unit.

This object is accomplished by providing a circuit which may, in one embodiment, be similar to a random access memory cell but having an unbalanced load structure to insure that the cell assumes a predetermined state upon application of power. After application of power, the cell is forced or "written" into its other stable state, and, in the event of a power interruption, a charge transfer takes place which restores the cell to its original "unwritten" state.

BRIEF DESCRIPTION OF DRAWING

The FIGURE shows one embodiment of a circuit of the invention.

DETAILED DESCRIPTION OF INVENTION

The FIGURE shows a circuit according to the instant invention in which a pair of N-channel MOS transistors 10 and 12 are shown connected in a cross-coupled mode. The source of N-channel transistor 10 is connected to a ground or "zero" potential, and the drain of transistor 10 is connected to a point referenced as node A. Also connected between node A and a source of power for the circuit ($V_{DD}$) is a load for transistor 10 which in a preferred embodiment may be a high impedance resistor 14 formed of lightly doped or undoped polysilicon material.

The source of transistor 12 is connected to ground potential and the drain thereof is connected to a point referenced as node B. Also connected to node B is the drain of a P-channel MOS transistor 16 which has its source connected to voltage level $V_{DD}$. Transistor 16 represents an active load device for transistor 12.

The gate of transistor 10 is coupled to node B, and the gate of transistor 12 is coupled to node A. Coupled between node A and node B are the source and drain of a second P-channel MOS transistor 18. The gate of transistor 18 is connected to a source of potential $V_{DD}$.

Except for transistor 18, the circuit as presented is similar to circuits which are utilized as storage cells in the nature of flip-flops or cells in a random access memory, depending upon the use desired. Node A is coupled, through coupling transistor 20 to a column line 22 which, in a memory device, would connect to the sense amplifier and precharge circuitry. Similarly, node B is coupled, through coupling transistor 24 to a column line 26 which would be directed to the sense amplifier and precharge circuitry. The gates of transistors 20 and 24 are connected together and are presented to a terminal Write Enable/Read Enable (WE/RE).

In a conventional ram cell additional circuitry may be present and, such may be present in the circuit of the instant invention. Such circuitry is well known, however, and its inclusion in the FIGURE would only serve to obscure the critical elements of the circuit.

Additionally, although the circuit is shown in a representation of complementary MOS (CMOS), it is understood that other technologies may be equally applicable for implementation of the invention. Of course, the load transistor 16 could, in this embodiment, be an N-channel device, and, generally, P-channel devices could be substituted for N-channel devices and vice versa if the $V_{DD}$ level were a negative voltage. In the preferred embodiment, $V_{DD}$ may range from 3 to 20 volts.

In operation, the cross coupled transistor cell is inherently unbalanced due to the relative gain of the P-channel load 16 over the polysilicon load resistor 14. That is, the impedance of the load resistor 14 is so high that the capacitance at node A (which is an intrinsic capacitance) takes much longer to be charged toward $V_{DD}$ than the capacitance at node B because of the relatively lower impedance of load 16 and the inherent gain of the transistor. During intial power-up, the cell formed by the cross-coupled transistors 10 and 12 will toggle to the state in which node A is low and node B approaches $V_{DD}$. This occurs since when power is applied at $V_{DD}$, node A begins to rise very slowly while the gate of load 16 is already at a low potential. The gate of the P-channel device 16 being at a low potential turns device 16 fully on and node B charges very fast. As node B charges toward $V_{DD}$, transistor 10 is turned on since it is an N-channel device, which tends to pull node A toward ground or, in this case, zero potential.

Following initial power-up, the WE/RE is activated turning on transistors 20 and 24. A "write" voltage is applied on lines 20 and 26 such that line 22 is driven high or to $V_{DD}$ potential and line 26 is driven to zero potential. These potentials are thus applied to nodes A and B and, when WE/RE is removed, node A will remain in a high state and node B in a low state. The voltage on node A is equal to $V_{DD}-I_LR$. The cell is now in a state where it is able to sense a subsequent power reduction or interruption. Thus, if the cell is formed as a part of a circuit such as a memory or microprocessor, the interruption of power to that device may be determined.

If $V_{DD}$ fluctuates such that it is reduced more than a threshold voltage below the potential at node A, charge transfer transistor 18 begins to turn on. As transistor 18 turns on, the charge on node A is discharged to node B. As node B begins to rise as a result of the charge transfer, the gate of transfer 10 begins to turn transistor 10 on thus further discharging node A, and the discharge of node A turns P-channel load 16 on, applying a voltage of just less than $V_{DD}$ to node B. If the power rises again to $V_{DD}$, the state of the device will not change since the loads are inherently unbalanced. Further, if the voltage $V_{DD}$ were first applied when the device was brought back into use, the device would be powered up in the node A-low, node B-high mode as previously noted.

To sense whether the module with which the detection cell is associated has lost power, lines 22 and 26 are precharged in a conventional manner and WE/RE is activated. The sense amplifier senses the state of the cell and an indication is thus given that the power was interrupted or reduced if the cell is in a node A-low condition.

As previously noted, the device need not be fabricated in complementary MOS technology but may be fabricated in other suitable technologies as well. Further, it is possible to substitute a transistor for the resistive load 14 provided the transistor is weak enough to allow node A to rise more slowly than node B than at the time of power-up. Other obvious substitutions of elements may be made.

In its environment, the cell may be merely an extra cell in an array of cells in, for example, a memory or a register of a microprocessor. If it appears as a cell of a memory array, it would be addressable by conventional means in the manner that the remainder of the cells are addressed. The address circuitry, per se, is, of course, not shown since it is conventional.

While the invention has been described in terms of a power-down detection circuit, its utilization as a reset mechanism is also envisioned. When a power-down or power fluctuation condition occurs, the return of the state of the cell to the power-down state can be used in conjunction with a detector such as a sense amplifier, to initiate a reset cycle in a microprocessor. Reset mechanisms in a microprocessor are, of course, well known per se, and the instant device would be used merely as a trigger to initiate the reset operation.

While the invention has been described in terms of a preferred embodiment, other embodiments will become obvious to the skilled practitioner. The scope of the invention is intended to be limited only by the scope of the claims appended hereto.

We claim:

1. A circuit for detecting supply voltage variations thereto comprising,
(a) binary means for indicating the circuit to be in a first or second state,
(b) means associated with said binary means for causing said binary means to assume a first of said first or second states upon application of a source of power to said circuit,
(c) means coupled to said binary means for forcing said binary means to the second of said first or second states, and
(d) further means coupled to said binary means and to said source of power for causing said binary means to reassume said first state in the event of reduction of voltage from said source of power to said circuit.

2. A circuit as set forth in claim 1 wherein said binary means is a flip-flop.

3. A circuit as set forth in claim 1 wherein said binary means is a memory cell.

4. A circuit as set forth in claim 1 wherein said binary means is a pair of cross-coupled transistors.

5. A circuit as set forth in claim 4 wherein said means for causing said binary means to assume a first state comprises a pair of load devices each connected to one of said pair of cross-coupled transistors, and in said load devices are unequal in gain.

6. A circuit as set forth in claim 5 wherein the connection of each load to its respective transistor defines a node, and further comprising means connected between said nodes whereby a reduction in voltage from said source of power causes a coupling of said nodes.

7. A circuit for detecting power variations comprising:
(a) a first transistor and a second transistor connected in a cross-coupled configuration;
(b) said first transistor having a first load coupled thereto at a first node and to a power supply potential;
(c) said second transistor having a second load coupled thereto at a second node and to a power supply potential, said second load having a relatively higher gain than said first load, thereby causing the circuit to assume, upon application of power thereto, a first state;
(d) means for applying a signal to said circuit, said signal causing the circuit to assume a second state;
(e) a third transistor coupled between said first and second nodes and having an electrode coupled to said power supply potential;
(f) whereby a reduction in power supply potential causes the circuit to revert to said first state.

8. A circuit as set forth in claim 7 wherein said reversion to said first state is due to charge transfer between said first and second nodes.

9. A circuit as set forth in claim 7 wherein said first transistor and said second transistor are of a first polarity type and said third transistor is of opposite polarity type.

10. A circuit as set forth in claim 7 wherein said first load is a passive load and said second load is an active load.

* * * * *

UNITED STATES PATENT AND TRADEMARK OFFICE
CERTIFICATE OF CORRECTION

PATENT NO. : 4,366,560
DATED : December 28, 1982
INVENTOR(S) : Mark W. McDermott et al It is certified that error appears in the above-identified patent and that said Letters Patent are hereby corrected as shown below:

In column 4, claim 5, line 21, change "in" to --wherein--.

Signed and Sealed this

Twenty-second Day of March 1983

[SEAL]

Attest:

GERALD J. MOSSINGHOFF

Attesting Officer

Commissioner of Patents and Trademarks